(12) United States Patent
Choi

(10) Patent No.: US 8,575,996 B2
(45) Date of Patent: *Nov. 5, 2013

(54) SEMICONDUCTOR APPARATUS TRANSMITTING SIGNALS BETWEEN STACKED CHIPS

(75) Inventor: Min Seok Choi, Ichon (KR)

(73) Assignee: SK Hynix Inc., Gyeonggi-do (KR)

( * ) Notice: Subject to any disclaimer, the term of this patent is extended or adjusted under 35 U.S.C. 154(b) by 198 days.

This patent is subject to a terminal disclaimer.

(21) Appl. No.: 13/169,430

(22) Filed: Jun. 27, 2011

(65) Prior Publication Data

US 2012/0194228 A1 Aug. 2, 2012

(30) Foreign Application Priority Data

Jan. 31, 2011 (KR) .................. 10-2011-0009805

(51) Int. Cl.
*G11C 7/00* (2006.01)

(52) U.S. Cl.
USPC .................. 327/525; 365/225.7; 327/291

(58) Field of Classification Search
USPC .................. 327/291, 525; 365/225.7
See application file for complete search history.

(56) References Cited

U.S. PATENT DOCUMENTS

| 7,849,237 B2 | 12/2010 | Nonomura et al. | |
| 2010/0295189 A1* | 11/2010 | Chou et al. | 257/777 |
| 2011/0006391 A1* | 1/2011 | Lee et al. | 257/529 |
| 2011/0019368 A1* | 1/2011 | Andry et al. | 361/748 |
| 2011/0110064 A1* | 5/2011 | Foster et al. | 361/803 |
| 2011/0141828 A1* | 6/2011 | Yoko | 365/189.09 |
| 2012/0112312 A1* | 5/2012 | Perry et al. | 257/530 |
| 2012/0194243 A1* | 8/2012 | Choi et al. | 327/161 |
| 2012/0299640 A1* | 11/2012 | Foster et al. | 327/525 |

FOREIGN PATENT DOCUMENTS

| KR | 1020090113784 A | 2/2009 |
| KR | 1020110005390 A | 1/2011 |

* cited by examiner

*Primary Examiner* — Ryan Jager
(74) *Attorney, Agent, or Firm* — William Park & Associates Patent Ltd.

(57) ABSTRACT

A semiconductor apparatus may include a transmission control signal generation unit, a fuse signal transmission unit, a reception control signal generation unit and a fuse signal reception unit. The transmission control signal generation unit receives a clock signal and generates a plurality of divided clock signals based on the clock signal to output transmission control signals from the plurality of divided clock signals. The fuse signal transmission unit transmits fuse information in synchronization with the transmission control signals. The reception control signal generation unit receives the clock signal and generates the plurality of divided clock signals, and generates reception control signals based on the plurality of divided clock signals. The fuse signal reception unit receives the fuse information in synchronization with the reception control signals.

20 Claims, 9 Drawing Sheets

SEMICONDUCTOR APPARATUS TRANSMITTING SIGNALS BETWEEN STACKED CHIPS

CROSS-REFERENCES TO RELATED APPLICATION

The present application claims priority under 35 U.S.C. §119(a) to Korean Patent Application No. 10-2011-0009805, filed on Jan. 31, 2011, in the Korean Intellectual Property Office, which is incorporated herein by reference in its entirety as if set forth in full.

BACKGROUND

1. Technical Field

Various embodiments of the present invention relate to a semiconductor memory apparatuses. In particular, certain embodiments relate to a 3D (three-dimensional) semiconductor apparatus having a plurality of stacked chips.

2. Related Art

In order to increase the degree of integration of a semiconductor apparatus, there has been developed a three-dimensional semiconductor apparatus with a plurality of stacked and packaged chips. Since two or more chips are vertically stacked, the 3D semiconductor apparatus can achieve a higher degree of integration in an equivalent space.

Various schemes exist to realize the three-dimensional semiconductor apparatus. In one of such schemes, a plurality of chips with an identical structure are stacked and the stacked chips are coupled to one another using wires such as metal lines, so that they operate as a single semiconductor apparatus.

Also, recently, a TSV (through-silicon via) type semiconductor apparatus has been disclosed in the art, in which silicon vias are formed through a plurality of stacked chips so that all the chips are electrically connected to one another. Since the chips are electrically connected to one another through the silicon vias vertically passing through the chips in the TSV type semiconductor apparatus, it is possible to efficiently reduce the area of a package, as compared with a semiconductor apparatus in which respective chips are electrically connected to one another through bonding wirings placed at the edges around the chips.

The number of TSVs for connecting the plurality of chips tends to increase in proportion to the degree of integration of the semiconductor apparatus. Therefore, along with the increase in the number of TSVs, a technology for replacing failed TSVs with normal TSVs is needed. This can be accomplished using fuse information, for example, a fuse circuit for storing information as to whether TSVs are normal or failed. The fuse circuit disposed in each of the stacked chips might help to solve a problem which is likely to occur in association with the replacement of TSVs, but such circuit configuration may lead to inefficiency for securing a chip area.

SUMMARY

Accordingly, there is a need for an improved semiconductor apparatus which is capable of transmitting fuse information to a plurality of chips which comprise a single semiconductor apparatus.

To attain the advantages and in accordance with the purposes of the invention, as embodied and broadly described herein, one exemplary aspect of the present invention may provide a semiconductor apparatus which includes: a transmission control signal generation unit configured to receive a clock signal and generate a plurality of divided clock signals based on the clock signal to output transmission control signals from the plurality of divided clock signals; a fuse signal transmission unit configured to transmit fuse information in synchronization with the transmission control signals; a reception control signal generation unit configured to receive the clock signal and generate the plurality of divided clock signals, and generate reception control signals based on the plurality of divided clock signals; and a fuse signal reception unit configured to is receive the fuse information in synchronization with the reception control signals.

In another exemplary aspect of the present invention, a semiconductor apparatus may include: a clock division unit configured to divide a clock signal and generate a plurality of divided clock signals; a signal transmission block configured to transmit fuse information in response to the divided clock signals; a master chip signal reception block disposed in a master chip, and configured to receive the fuse information in response to the plurality of divided clock signals and generate through-silicon via (TSV) selection signals; and a slave chip signal reception block disposed in a slave chip, and configured to receive the fuse information in response to the plurality of divided clock signals and generate the TSV selection signals.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and is constitute a part of this specification, illustrate various embodiments consistent with the invention and, together with the description, serve to explain the principles of the invention.

DETAILED DESCRIPTION

Figure 1:
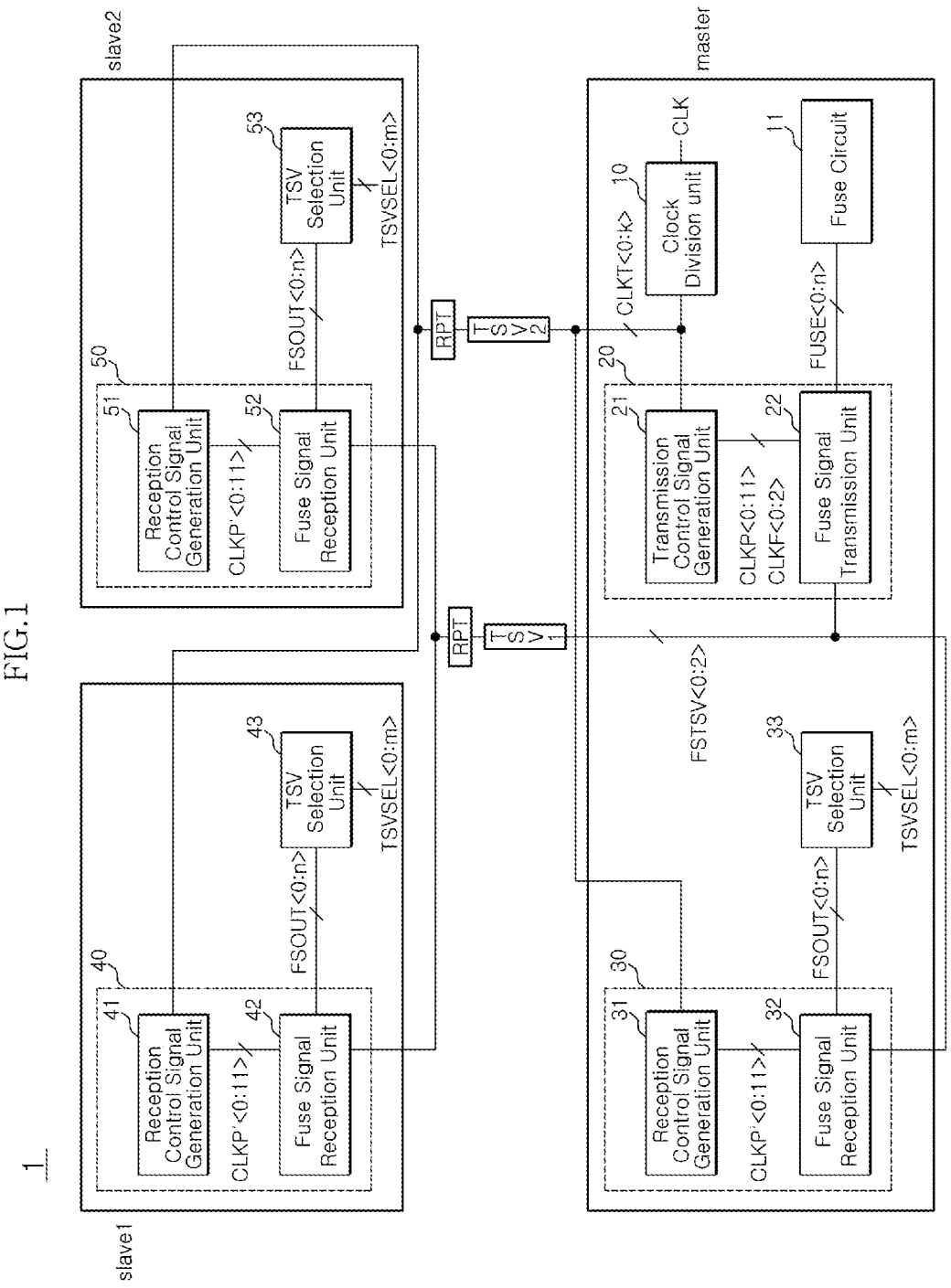
FIG. 1 is a block diagram schematically illustrating the configuration of a semiconductor apparatus in accordance with an embodiment of the present invention.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a block diagram schematically illustrating the configuration of a semiconductor apparatus in accordance with an embodiment of the present invention. In FIG. 1, a semiconductor apparatus 1 is illustrated to include a master chip master and first and second slave chips slave1 and slave2. However, the number of stacked chips is not limited thereto. Since the master chip master and the slave chips slave1 and slave2 are packaged while they are stacked, they are included in a single semiconductor apparatus and are electrically connected with one another through through-silicon vias (TSVs).

In one exemplary embodiment as illustrated in FIG. 1, the is master chip master may include a clock division unit 10 and a signal transmission block 20. In this embodiment, the clock division unit 10 is configured to receive a clock signal CLK, divide the clock signal CLK and generate a plurality of divided clock signals CLKT<0:k>. The signal transmission block 20 is configured to transmit fuse information in response to transmission control signals CLKP<0:11> and CLKF<0:2>. The fuse information is contained in fuse signals FUSE<0:n>, which are generated in a fuse circuit 11 which includes a plurality of fuse sets depending upon whether or not respective fuses are cut, and may include all information signals which may be used in a semiconductor apparatus. In the exemplary embodiment, the fuse information is specifically exemplified as having information as to whether or not a failed TSV exists and as to which TSV has failed, if any. However, signals to be transmitted according to the exemplary embodiment are not limited to the fuse signals FUSE<0:n>, but may include any signals which may be communicated in a semiconductor apparatus. The signal transmission block 20 outputs the fuse signals FUSE<0:n> as fuse transmission signals FSTSV<0:2> in synchronization with the transmission control signals CLKP<0:11> and CLKF<0:2>.

The signal transmission block 20 may include a transmission control signal generation unit 21 and a fuse signal transmission unit 22. The transmission control signal generation unit 21 is configured to generate the transmission control signals CLKP<0:11> and CLKF<0:2> in response to the divided clock signals CLKT<0:k>. The is fuse signal transmission unit 22 is configured to receive the fuse signals FUSE<0:n> and output the fuse signals FUSE<0:n> as fuse transmission signals FSTSV<0:2> in synchronization with the transmission control signals CLKP<0:11> and CLKF<0:2>. The outputted fuse transmission signals FSTSV<0:2> may be transmitted to one or more of the master chip master and the first and second slave chips slave1 and slave2 directly or through a first TSV TSV1.

The master chip master and the first and second slave chips slave1 and slave2 may include signal reception blocks 30, 40 and 50, respectively. The signal reception blocks 30, 40 and 50 are configured to receive the fuse information transmitted from the signal transmission block 20. The signal reception blocks 30, 40 and 50 receive the fuse information based on reception control signals CLKP'<0:11>. Specifically, the signal reception blocks 30, 40 and 50 receive the fuse transmission signals FSTSV<0:2> in synchronization with the reception control signals CLKP'<0:11>. The signal reception blocks 30, 40 and 50 may generate fuse output signals FSOUT<0:n> based on the received fuse transmission signals FSTSV<0:2>.

The signal reception blocks 30, 40 and 50 include reception control signal generation units 31, 41 and 51 and fuse signal reception units 32, 42 and 52, respectively. Each of the reception control signal generation units 31, 41 and 51 is configured to generate the reception control signal CLKP'<0:11> in response to the divided clock signals CLKT<0:k>. In the exemplary embodiment, the reception control signals CLKP'<0:11> have substantially the same is phase as the transmission control signals CLKP<0:11>. Accordingly, the reception control signal generation units 31, 41 and 51 may be configured in the same manner as the transmission control signal generation unit 21. The fuse signal reception units 32, 42 and 52 are configured to receive the fuse transmission signals FSTSV<0:2> in response to the reception control signals CLKP'<0:11> and generate the fuse output signals FSOUT<0:n>. Specifically, the fuse signal reception units 32, 42 and 52 are configured to generate the fuse output signals FSOUT<0:n> from the fuse transmission signals FSTSV<0:2> in synchronization with the reception control signals CLKP'<0:11>. As described above, since the transmission control signals CLKP<0:11> generated from the transmission control signal generation unit 21 have the same phases as the reception control signals CLKP'<0:11> generated from the reception control signal generation units 31, 41 and 51, the master chip master and the first and second slave chips slave1 and slave2 may receive the fuse transmission signals FSTSV<0:2> at a timing at which the fuse transmission signals FSTSV<0:2> are transmitted from the signal transmission block 20. In other words, as the signal transmission block 20 outputs the fuse transmission signals FSTSV<0:2> in synchronization with the transmission control signals CLKP<0:11> and CLKF<0:2>, the signal reception blocks 30, 40 and 50 may receive the fuse transmission signals FSTSV<0:2> in synchronization with the reception control signals CLKP'<0:11> and generate the fuse output signals FSOUT<0:n>. Accordingly, the fuse information of the fuse circuit 11 may be transmitted to the signal reception blocks 30, 40 and 50.

The fuse transmission signals FSTSV<0:2> may be transmitted to the first and second slave chips slave1 and slave2 through the first TSV TSV1. Further, the fuse transmission signals FSTSV<0:2> may be transmitted to the signal reception block 30 of the master chip master directly through a signal line, not through the first TSV TSV1. The semiconductor apparatus 1 further includes a second TSV TSV2 for transmitting the divided clock signals CLKT<0:k>. The second TSV TSV2 may be connected through the master chip master and the first and second slave chips slave1 and slave2 and may transmit the divided clock signals CLKT<0:k> to the respective chips. The second TSV TSV2 may include a plurality of TSVs which correspond to the number of the divided clock signals CLKT<0: k>.

Meanwhile, as an alternative configuration, the clock division unit 10 may be provided in each of the first and second slave chips slave1 and slave2. In this case, the clock signal CLK may be transmitted to the first and second slave chips slave1 and slave2, and the plurality of divided clock signals CLKT<0:k> may be generated by the clock division unit 10 provided in each of the first and second slave chips slave1 and slave2. In such an alternative embodiment, fewer TSVs are needed for transmission of clock signals.

In FIG. 1, the semiconductor apparatus 1 may further include repeaters RPT for respectively buffering the fuse transmission signals FSTSV<0:2> and the divided clock signals CLKT<0:k> transmitted through the first TSV TSV1 and the second TSV TSV2, respectively.

In FIG. 1, the master chip master and the first and second slave chips slave1 and slave2 of the semiconductor apparatus 1 may further include TSV selection units 33, 43 and 53 each for receiving the fuse output signals FSOUT<0:n> and generating TSV selection signals TSVSEL<0:m>. The TSV selection units 33, 43 and 53 are configured to decode the fuse output signals FSOUT<0:n> and generate the TSV selection signals TSVSEL<0:nn>. As described above, in the exemplary embodiment, the fuse information is exemplified to be information of failed TSVs. Thus, the TSV selection units 33, 43 and 53 may be used for repair operations for replacing failed TSVs with normal TSVs.

Figure 2:
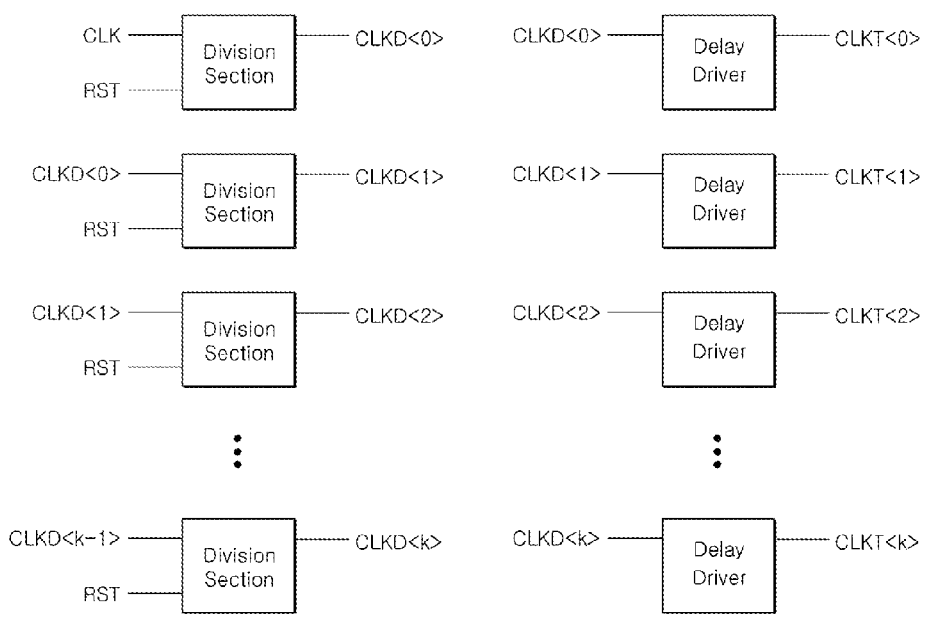
FIG. 2 is a block diagram schematically illustrating the configuration of an exemplary embodiment of a clock division unit shown in FIG. 1.

FIG. 2 is a block diagram schematically illustrating the configuration of an exemplary embodiment of the clock division unit 10 shown in FIG. 1. As shown in FIG. 2, the clock division unit 10 may include a plurality of division sections and a plurality of delay drivers. The plurality of division sections are connected in series and generate a plurality of delayed clock signals CLKD<0:k> from the clock signal CLK. The division sections generate the delayed clock signals CLKD<0:k> by dividing, for example, but not limited to, by two, the inputted clock signal CLK and the delayed clock signals CLKD<0:k−1>. The division sections further receive a reset signal RST and may be initialized when the reset signal RST is inputted. For example, the division sections may comprise T-flip-flops. The plurality of delay drivers respectively receive the plurality of delayed clock signals CLKD<0:k> and respectively generate the plurality of divided clock signals CLKT<0:k>. The delay drivers may comprise buffers and perform a function of controlling a delay amount and a driving force and align the (rising or falling) edges of the delayed clock signals CLKD<0:k>. Accordingly, as the clock division unit 10 includes the delay drivers, it can generate the plurality of divided clock signals CLKT<0:k> with aligned edges. The divided clock signals CLKT<0:k> generated by the clock division unit 10 have a cycle longer than that of the clock signal CLK. Therefore, the clock division unit 10 allows the transmission control signal generation unit 21 and the reception control signal generation units 31, 41 and 51 to secure timing margins for generating the transmission control signals CLKP<0:11> and CLKF<0:2> and the reception control signals CLKP'<0:11>.

Figure 3:
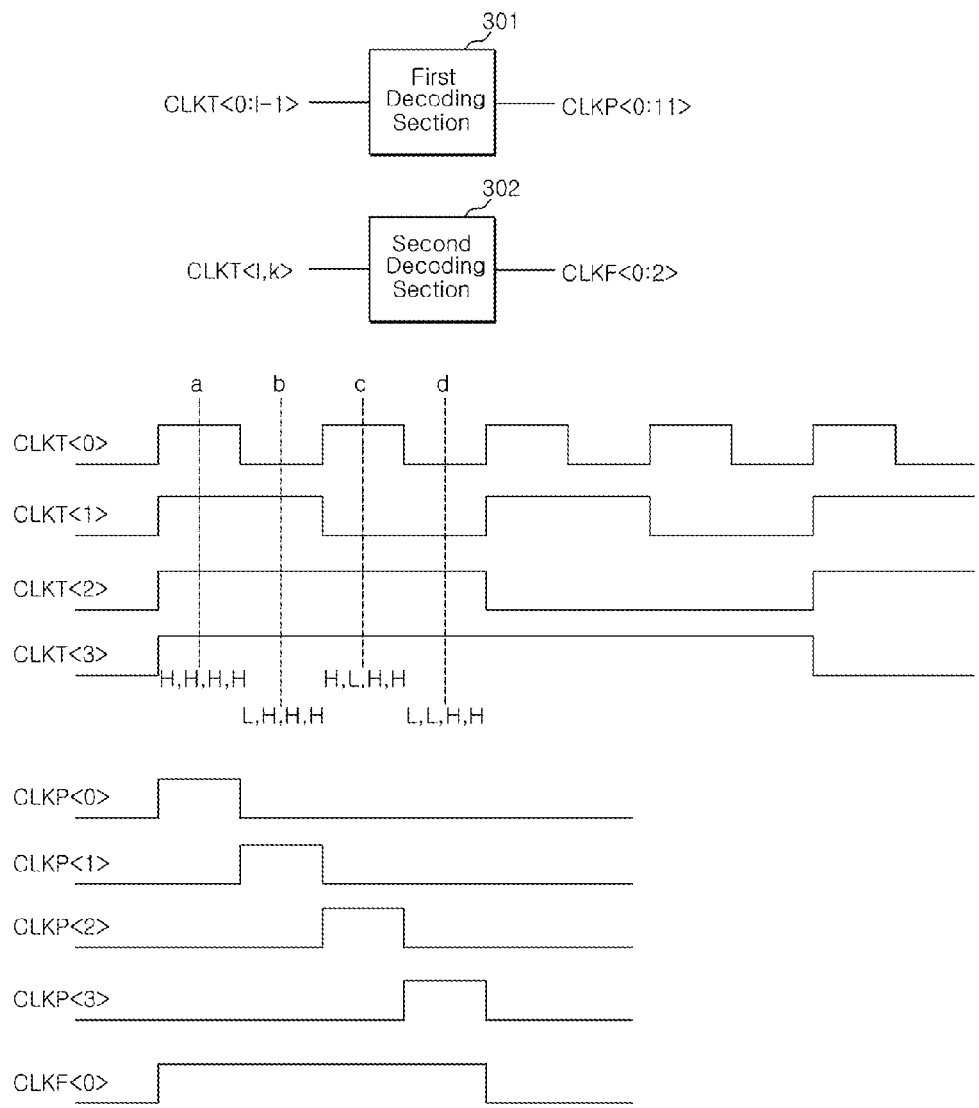
FIG. 3 is a diagram schematically illustrating the configuration and operations of an exemplary embodiment of a transmission control signal generation unit shown in FIG. 1.

FIG. 3 is a diagram schematically illustrating the configuration and operations of an exemplary embodiment of the transmission control signal generation unit 21 shown in FIG. 1. In FIG. 3, the transmission control signal generation unit 21 may include a clock decoding section configured to decode the plurality of divided clock signals CLKT<0:k> and generate the transmission control signals CLKP<0:11> and CLKF<0:2> which are sequentially enabled. As shown in FIG. 3, the clock decoding section may include a first decoding section 301 and a second decoding section 302. The first is decoding section 301 receives a part of divided clock signals CLKT<0:I−1>. The first decoding section 301 decodes the part of divided clock signals CLKT<0:I−1> and generates the transmission control signals CLKP<0:11>. The second decoding section 302 receives remaining divided clock signals CLKT<I:k>. The second decoding section 302 decodes the remaining divided clock signals CLKT<I:k> and generates the transmission control signals CLKF<0:2>.

Operations of the clock decoding section will be described below with reference to FIG. 3. Hereinafter, it will be exemplified that fifteen transmission control signals CLKP<0:11> and CLKF<0:2> are generated, and, in particular, operations for generating five transmission control signals CLKP<0:3> and CLKF<0> are shown in FIG. 3. The first to fourth divided clock signals CLKT<0:3> have a cycle difference corresponding to twice a cycle as can be readily seen from FIG. 3. At a first timing a, all the first to fourth divided clock signals CLKT<0:3> have a high level, and, as the first to fourth divided clock signals CLKT<0:3> are decoded, the transmission control signal CLKP<0> is enabled. At a second timing b, the first divided clock signal CLKT<0> has a low level and the second to fourth divided clock signals CLKT<1:3> have a high level, and as the first to fourth divided clock signals CLKT<0:3> are decoded, the transmission control signal CLKP<1> is enabled. At a third timing c, the second divided clock signal CLKT<1> has a low level and the first, third and fourth divided clock signals CLKT<0, 3, 4> have a high level, and as the first to fourth divided clock signals CLKT<0:3> are decoded, the transmission control signal CLKP<2> is enabled. At a fourth timing d, the first and second divided clock signals CLKT<0:1> have a low level and the third and fourth divided clock signals CLKT<2:3> have a high level, and as the first to fourth divided clock signals CLKT<0:3> are decoded, the transmission control signal CLKP<3> is enabled. Accordingly, the transmission control signals CLKP<0:3>, which are sequentially enabled based on decoding results of the divided clock signals CLKT<0:3>, may be generated by the first decoding section 301. Also, the second decoding section 302 generates the transmission control signal CLKF<0> which is consecutively enabled while the transmission control signals CLKP<0:3> are sequentially enabled. In this manner, the remaining transmission control signals CLKP<4:11> and CLKF<1:2> may be generated by the first and second decoding sections 301 and 302. A method for decoding the clock signals may be implemented in a variety of ways as are generally known in the art.

Meanwhile, as described above, the reception control signal generation units 31, 41 and 51 which are disposed in the master chip master and the slave chips slave1 and slave2, respectively, may have the same configuration as the transmission control signal generation unit 21 shown in FIG. 3. In the embodiment of the present invention, since it is sufficient that each of the reception control signal generation units 31, 41 and 51 generates the reception control signals CLKP'<0:11> which correspond to the transmission control signals CLKP<0:11>, the reception control signal generation units 31, 41 and 51 may be configured to include the first decoding section 301 but without the need of including the second decoding section 302. Accordingly, each of the reception control signal generation units 31, 41 and 51 may generate the reception control signals CLKP'<0:11> which have substantially the same phases as the transmission control signals CLKP<0:11>.

Figure 4:
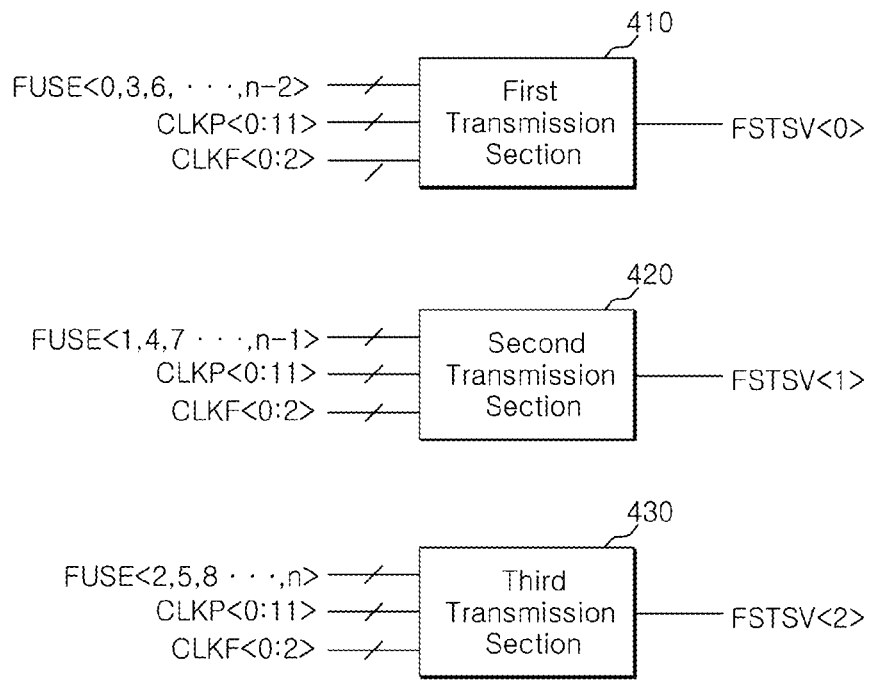
FIG. 4 is a block diagram schematically illustrating the configuration of an exemplary embodiment of a fuse signal transmission unit shown in FIG. 1.

FIG. 4 is a block diagram schematically illustrating the configuration of an exemplary embodiment of the fuse signal transmission unit 22 shown in FIG. 1. As shown in FIG. 4, the fuse signal transmission unit 22 may include first to third transmission sections 410, 420 and 430. The first to third transmission sections 410, 420 and 430 commonly receive the transmission control signals CLKP<0:11> and CLKF<0:2>. The first transmission section 410 is configured to receive a part of fuse signals FUSE<0, 3, 6, . . . , n−2> among the fuse signals FUSE<0:n>, the second transmission section 420 is configured to receive another part of fuse signals FUSE<1, 4, 7, . . . , n−1> among the fuse signals FUSE<0:n>, and the third transmission section 430 is configured to receive a remaining part of fuse signals FUSE<2, 5, 8, . . . , n> among the fuse signals FUSE<0:n>. Namely, any one of the fuse signals FUSE<0:n> is received by only one of the respective first to third transmission sections 410, 420 and 430. Accordingly, the fuse signal transmission unit 22 may transmit at a time multiple fuse signals FUSE<0:n> in response to some of the transmission control signals CLKP<0:11> and CLKF<0:2>. Specifically, if the transmission control signal CLKP<0> is enabled, the first transmission section 410 generates the fuse transmission signal FSTSV<0> from the fuse signal FUSE<0> and outputs the generated fuse transmission signal FSTSV<0>, the second transmission section 420 generates the fuse transmission signal FSTSV<1> from the fuse signal FUSE<1> and outputs the generated fuse transmission signal FSTSV<1>, and the third transmission section 430 generates the fuse transmission signal FSTSV<2> from the fuse signal FUSE<2> and outputs the generated fuse transmission signal FSTSV<2>. If the transmission control signal CLKP<1> is enabled, the first transmission section 410 generates the fuse transmission signal FSTSV<0> from the fuse signal FUSE<3> and outputs the generated fuse transmission signal FSTSV<0>, the second transmission section 420 generates the fuse transmission signal FSTSV<1> from the fuse signal FUSE<4> and outputs the generated fuse transmission signal FSTSV<1>, and the third transmission section 430 generates the fuse transmission signal FSTSV<2> from the fuse signal FUSE<5> and outputs the generated fuse transmission signal FSTSV<2>. Accordingly, the fuse signal transmission unit 22 receives the fuse signals FUSE<0:n> inputted in parallel and outputs the fuse transmission signals FSTSV<0:2> in series. The fuse signal transmission unit 22 including the first to third transmission sections 410, 420 and 430 can transmit thirty six fuse signals in response to the fifteen transmission control signals CLKP<0:11> and CLKF<0:2>. However, the number of fuse signals is not limited thereto, and a person skilled in the art will readily appreciate that the number of fuse signals to be transmitted may be adjusted depending upon the number of transmission sections and the number of transmission control signals.

Figure 5:
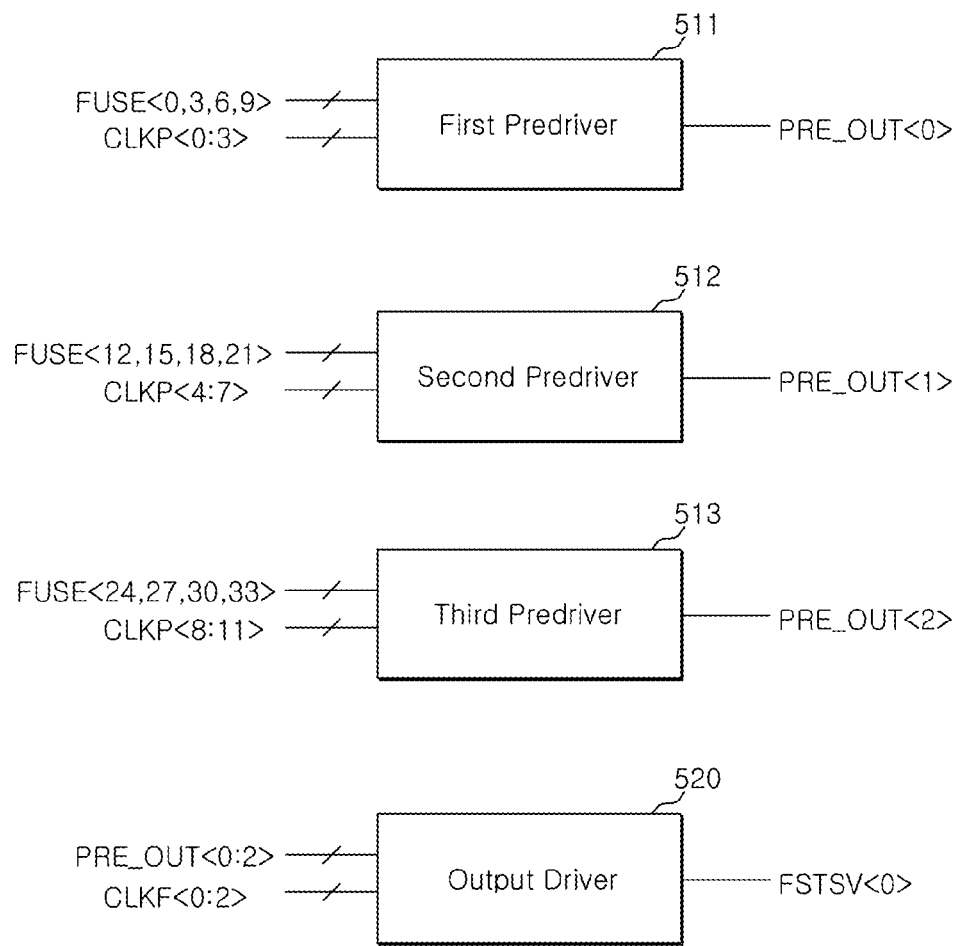
FIG. 5 is a block diagram schematically illustrating the configuration of an exemplary embodiment of a first transmission section shown in FIG. 4.

FIG. 5 is a block diagram schematically illustrating the configuration of an exemplary embodiment of the first transmission section 410 shown in FIG. 4. The first transmission section 410 may include first to third predrivers 511 to 513 and an output driver 520. The first to third predrivers 511 to 513 respectively receive assigned fuse signals FUSE<0, 3, 6, 9>, FUSE<12, 15, 18, 21> and FUSE<24, 27, 30, 33> when assuming that the fuse signals FUSE<0:n> are thirty six fuse signals in total, and assigned transmission control signals CLKP<0:3>, CLKP<4:7> and CLKP<8:11>. The first to third predrivers 511 to 513 generate first to third driving fuse signals PRE_OUT<0:2> from the assigned fuse signals FUSE<0, 3, 6, 9>, FUSE<12, 15, 18, 21> and FUSE<24, 27, 30, 33> in response to the assigned transmission control signals CLKP<0:3>, CLKP<4:7> and CLKP<8:11>, and outputs the generated first to third driving fuse signals PRE_OUT<0:2>. All the first to third driving fuse signals PRE_OUT<0:2> are outputted through the output driver 520. The transmission control signals CLKF<0:2> generated by the second decoding section 402 serve to solve the problem that the first to third driving fuse signals PRE_OUT<0:2> generated from the first to third predrivers 511 to 513 may collide each other.

The output driver 520 receives the first to third driving fuse is signals PRE_OUT<0:2> and generates the fuse transmission signal FSTSV<0> in response to the transmission control signals CLKF<0:2>. The output driver 520 generates the fuse transmission signal FSTSV<0> from the first driving fuse signal PRE_OUT<0> in response to the first transmission control signal CLKF<0>, generates the fuse transmission signal FSTSV<0> from the second driving fuse signal PRE_OUT<1> in response to the second transmission control signal CLKF<1>, and generates the fuse transmission signal FSTSV<0> from the third driving fuse signal PRE_OUT<2> in response to the third transmission control signal CLKF<2>.

Figure 6:
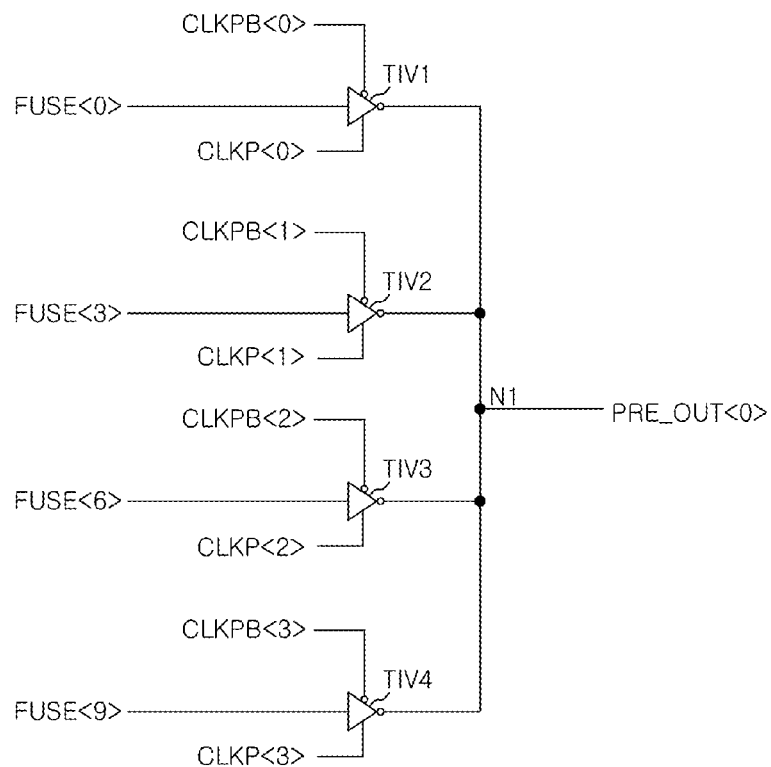
FIG. 6 is a circuit diagram illustrating one exemplary configuration of a first predriver shown in FIG. 5.

FIG. 6 is a circuit diagram illustrating one exemplary configuration of the first predriver 511 shown in FIG. 5. The first predriver 511 may include first to fourth tri-state inverters TIV1 to TIV4 and a driving node N1. The first tri-state inverter TIV1 inverts the fuse signal FUSE<0> in response to the transmission control signal CLKP<0> and an inverted signal CLKPB<0> thereof, and outputs the resultant signal to the driving node N1 or prohibits the output of the resultant signal to the driving node N1. The second tri-state inverter TIV2 inverts the fuse signal FUSE<3> in response to the transmission control signals CLKP<1> and an inverted signal CLKPB<1> thereof, and outputs the resultant signal to the driving node N1 or prohibits the output of the resultant signal to the driving node N1. Similarly, the third and fourth tri-state inverters TIV3 and TIV4 invert the fuse signals FUSE<6, 9> in response to the transmission control signals CLKP<2:3> and inverted signals CLKPB<2:3> thereof, and output the resultant signals to the driving node N1 or prohibit the output of the resultant signals to the driving node N1. Accordingly, the first predriver 511 inversely drives the fuse signal FUSE<0> when the transmission control signal CLKP<0> is enabled, and generates the first driving fuse signal PRE_OUT<0>. Similarly, the first predriver 511 inversely drives the fuse signals FUSE<3, 6, 9> when the transmission control signals CLKP<1:3> are enabled, and generates the first driving fuse signal PRE_OUT<0>. Because the second and third predrivers 512 and 513 may be configured in the same manner as the first predriver 511, additional explanations therefor will be omitted.

Figure 7:
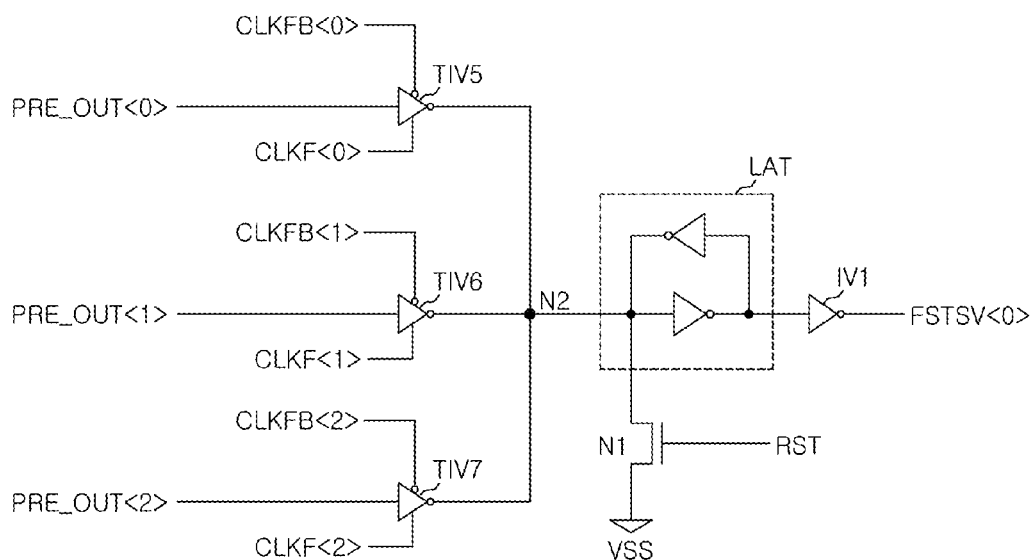
FIG. 7 is a circuit diagram illustrating an exemplary configuration of an output driver shown in FIG. 5.

FIG. 7 is a circuit diagram illustrating an exemplary configuration of the output driver 520 shown in FIG. 5. As shown in FIG. 7, the output driver 520 may include fifth to seventh tri-state inverters TIV5 to TIV7, a latch LAT, first inverter IV1, and an NMOS transistor N1. The fifth tri-state inverter TIV5 allows or prohibits the transmission of the first driving fuse signal PRE_OUT<0> outputted from the first predriver 511, in response to the transmission control signal CLKF<0> and the inverted signal CLKFB<0> thereof. The sixth tri-state inverter TIV6 allows or prohibits the transmission of the second driving fuse signal PRE_OUT<1> outputted from the second predriver 512, in response to the transmission control signal CLKF<1> and the inverted signal CLKFB<1> thereof. The seventh tri-state inverter TIV7 allows or prohibits the transmission of the third driving fuse signal PRE_OUT<2> outputted from the third predriver 513, in response to the transmission control signal CLKF<2> and the inverted signal CLKFB<2> thereof. The output terminals of the fifth to seventh tri-state inverters TIV5 to TIV7 are commonly connected to a node N2. The latch LAT latches the voltage level of the node N2 and outputs an inverted signal of the voltage of the node N2. Accordingly, the output driver 520 may generate the fuse transmission signal FSTSV<0> from the first driving fuse signal PRE_OUT<0> while the transmission control signal CLKF<0> is enabled, generate the fuse transmission signal FSTSV<0> from the second driving fuse signal PRE_OUT<1> while the transmission control signal CLKF<1> is enabled, and generate the fuse transmission signal FSTSV<0> from the third driving fuse signal PRE_OUT<2> while the transmission control signal CLKF<2> is enabled. Therefore, the first to third driving fuse signals PRE_OUT<0:2> may be outputted sequentially through the output driver 520 without colliding with one another.

The first inverter IV1 inverts the output of the latch LAT and generates the fuse transmission signal FSTSV<0>. The NMOS transistor N1 receives the output of the reset signal RST and resets the node N2 to a ground voltage level. Therefore, the output driver 520 may be initialized in response to the reset signal RST.

As described above, the second and third transmission sections 420 and 430 have the same configuration as the first transmission section 410 described above with reference to FIGS. 5 to 7. Therefore, the fuse transmission signals FSTSV<0:2> may be generated by the first to third transmission sections 410 to 430 while the transmission control signals CLKF<0:2> are enabled.

Figure 8:
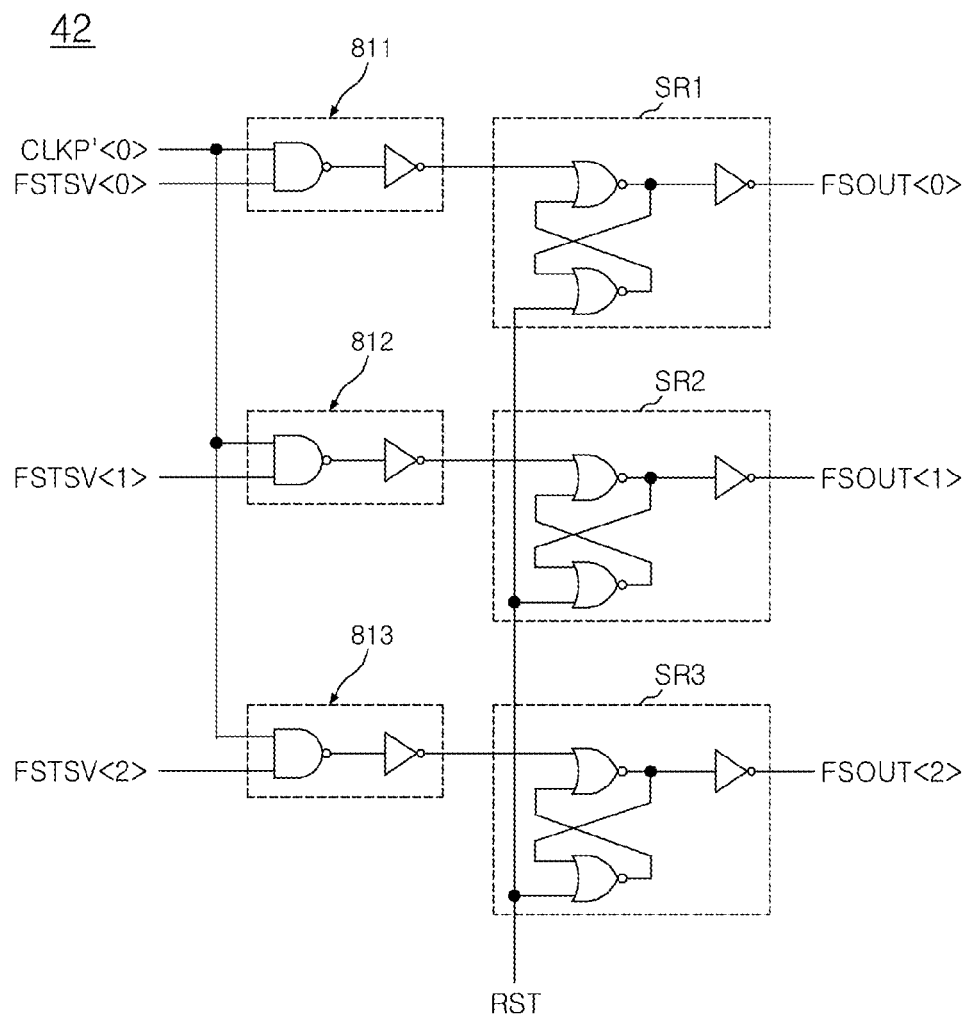
FIG. 8 is a circuit diagram illustrating an exemplary configuration of a fuse signal reception unit shown in FIG. 1.

FIG. 8 is a circuit diagram illustrating an exemplary configuration of the fuse signal reception unit 42 of the signal reception block 40 disposed in the first slave chip slave1 in FIG. 1. As shown in FIG. 8, the fuse signal reception unit 42 may include first to third AND gates 811, 812 and 813, and first to third SR latch sections SR1 to SR3. The first AND gate 811 receives the reception control signal CLKP'<0> and the fuse transmission signal FSTSV<0>. The first SR latch section SR1 enables the fuse output signal FSOUT<0> to a high level when the output of the first AND gate 811 is enabled to a high level, and disables the fuse output signal FSOUT<0> to a low level in response to the reset signal RST. The second AND gate 812 receives the reception control signal CLKP'<0> and the fuse transmission signal FSTSV<1>. The second SR latch section SR2 enables the fuse output signal FSOUT<1> to a high level when the output of the second AND gate 812 is enabled to a high level, and disables the fuse output signal FSOUT<1> to a low level in response to the reset signal RST. The third AND gate 813 receives the reception control signal CLKP'<0> and the fuse transmission signal FSTSV<2>. The third SR latch section SR3 enables the fuse output signal FSOUT<2> to a high level when the output of the third AND gate 813 is enabled to a high level, and disables the fuse output signal FSOUT<2> to a low level in response to the reset signal RST. This configuration of the fuse signal reception unit 42 may be is provided by the same number as the number of the reception control signals CLKP'<0:11>. Accordingly, the fuse signal reception unit 42 may generate the fuse output signals FSOUT<0:n> to be outputted in parallel, from the fuse transmission signals FSTSV<0:2> which are inputted in series. The fuse signal reception unit 42 may receive the fuse transmission signals FSTSV<0:2> transmitted from the signal transmission block 20 in synchronization with the enable timings of the reception control signals CLKP'<0:11>, and may generate the fuse output signals FSOUT<0:n> from the received fuse transmission signals FSTSV<0:2>. As a result, the signal transmission block 20 may transmit the thirty six fuse information exemplified above in synchronization with the transmission control signals CLKP<0:11>, and the signal reception block 40 may receive the thirty six fuse information in synchronization with the reception control signals CLKP'<0:11> which have substantially the same phases as the transmission control signals COUT<0:11>. Thus, the fuse information transmitted from the master chip master may be precisely transferred at the same timings to the master chip master and the first and second slave chips slave1 and slave2.

Figure 9:
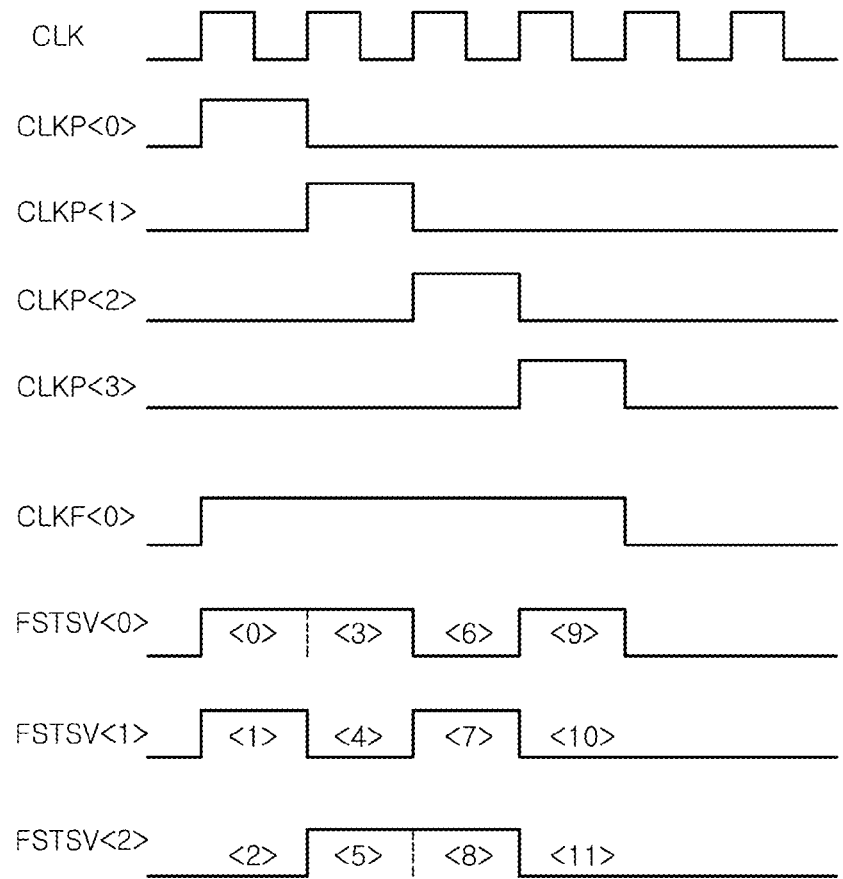
FIG. 9 is a timing diagram illustrating operations of the is semiconductor apparatus in accordance with the embodiment of the present invention.

FIG. 9 is a timing diagram illustrating operations of the semiconductor apparatus in accordance with an exemplary embodiment of the present invention. Operations of the semiconductor apparatus 1 in accordance with the embodiment of the present invention will be described below with reference to FIGS. 1 to 9. The transmission control signal generation unit 21 receives the is divided clock signals CLKT<0:k> and generates the transmission control signals CLKP<0:11> and CLKF<0:2>. The reception control signal generation unit 31 of the master chip master also receives the divided clock signals CLKT<0:k> and generates the reception control signals CLKP'<0:11> which have substantially the same phases as the transmission control signals CLKP<0:11>. The reception control signal generation units 41 and 51 of the first and second slave chips slave1 and slave2 receive the divided clock signals CLKT<0:k> transmitted through the second TSV TSV2 and generate the reception control signals CLKP'<0:11>. The fuse signal transmission unit 22 generates the fuse transmission signals FSTSV<0:2> from the fuse signals FUSE<0:n> with the fuse information of the fuse circuit 11 based on the transmission control signals CLKP<0:11> and CLKF<0:2>, and transmits the generated fuse transmission signals FSTSV<0:2> through the first TSV TSV1. In FIG. 9, it can be seen that the fuse transmission signals FSTSV<0:2> generated from the first to third transmission sections 410, 420 and 430 are outputted in response to the transmission control signals CLKF<0:2> which are consecutively enabled while the transmission control signals CLKP<0:11> are sequentially enabled. The fuse transmission signal FSTSV<0> sequentially outputs the fuse information of the fuse signals FUSE<0, 3, 6, 9>, the fuse transmission signal FSTSV<1> sequentially outputs the fuse information of the fuse signals FUSE<1, 4, 7, 10>, and the fuse transmission signal FSTSV<2> sequentially outputs the fuse information of the fuse signals <2, 5, 8, 11>. The is fuse signal reception units 32, 42 and 52 may receive the fuse transmission signals FSTSV<0:2> in synchronization with the reception control signals CLKP'<0:11> and generate the fuse output signals FSOUT<0:n>.

Figure 10:
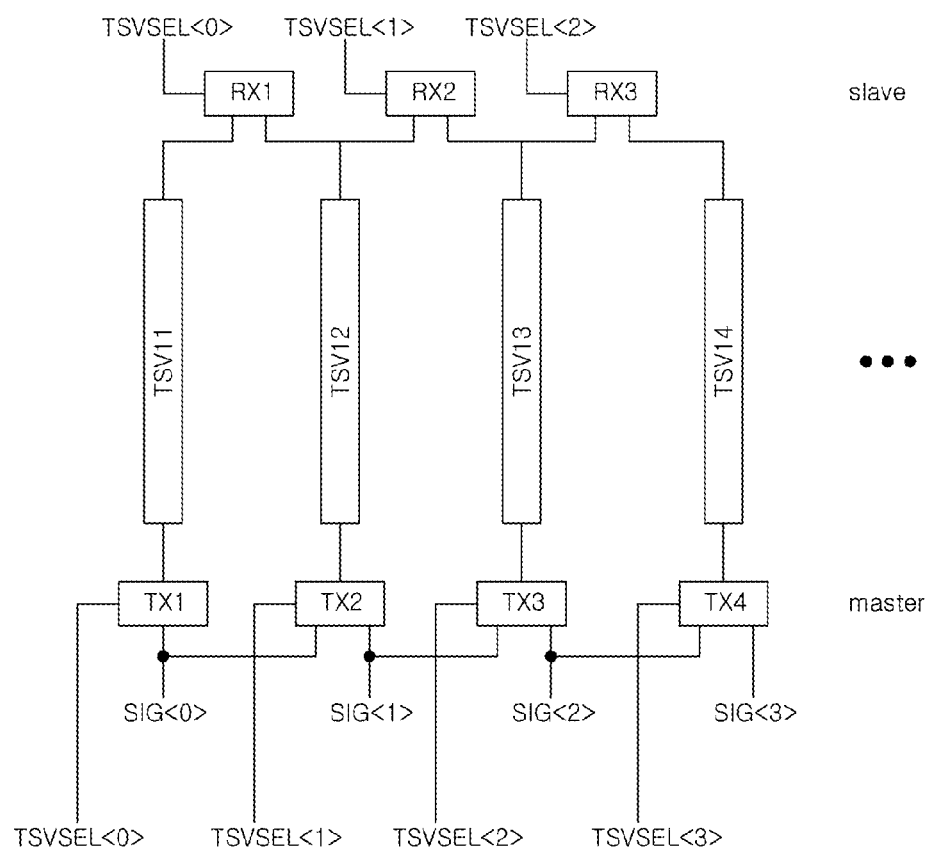
FIG. 10 is a diagram schematically illustrating the configuration of an exemplary embodiment of a repair circuit in which the fuse information transmitted by the semiconductor apparatus in accordance with the embodiment of the present invention may be used.

FIG. 10 is a diagram schematically illustrating the configuration of an exemplary embodiment of a repair circuit 60 in which the fuse information transmitted by the semiconductor apparatus 1 in accordance with the embodiment of the present invention may be used. As described above, the TSV selection units 33, 43 and 53 decode the fuse output signals FSOUT<0:n> generated by the signal reception blocks 30, 40 and 50 and generate the TSV selection signals TSVSEL<0:m>. For the purpose of exemplification, FIG. 10 illustrates a case that one master chip master and one slave chip slave are electrically connected with each other through four TSVs. A first TSV TSV11 transmits a first signal SIG<0> from the master chip master to the slave chip slave. Second to fourth TSVs TSV12 to TSV14 transmit second to fourth signals SIG<1:3> from the master chip master to the slave chip slave. The first to fourth TSVs TSV11 to TSV14 are connected to a plurality of transceivers TX1 to TX4 and receivers RX1 to RX3. Specifically, the transceivers TX1 to TX4 may receive together signals to be transmitted through assigned TSVs and adjacent TSVs, and may select TSVs through which the signals are to be transmitted, based on the TSV selection signals TSVSEL<0:3>. Similarly, the receivers RX1 to RX3 are connected to assigned TSVs and adjacent TSVs, and may receive the is signals transmitted from ones of the assigned TSVs and the adjacent TSVs based on the TSV selection signals TSVSEL<0:2>. Accordingly, TSVs through which the signals are to be transmitted may be selected based on the TSV selection signals TSVSEL<0:m>.

When assuming that the first, third and fourth TSVs TSV11, TSV13 and TSV14 are normal and the second TSV TSV12 has failed, in order for precise signal transmission, the second signal SIG<1> should not be transmitted through the second TSV TSV12 and should be transmitted through a normal TSV. Thus, a repair process is required. At this time, such repair information is outputted from the fuse circuit 11 of FIG. 1 as fuse information. The signal reception blocks 30, 40 and 50 receive the fuse information and generate the TSV selection signals TSVSEL<0:m>. The TSV selection signals TSVSEL<0:m> generated in the master chip master may be inputted to the transceivers TX1 to TX4 of FIG. 10, and the TSV selection signals TSVSEL<0:m> generated in the slave chip slave may be inputted to the receivers RX1 to RX3 of FIG. 10. The transceiver TX1 may transmit the first signal SIG<0> through the first TSV TSV11 in response to the TSV selection signal TSVSEL<0>, and the receiver RX1 may receive the first signal SIG<0> through the first TSV TSV11 in response to the TSV selection signal TSVSEL<0>. The transceivers TX2 and TX3 may transmit the second signal SIG<1> not through the second TSV TSV12 but through the third TSV TSV13 in response to the TSV selection signals TSVSEL<1:2>, and the receiver RX2 may receive the second signal SIG<1> through the third TSV TSV13 in response to the TSV selection signal TSVSEL<1>. Similarly, the transceivers TX3 and TX4 may transmit the third signal SIG<2> through the fourth TSV TSV14, and the receiver RX3 may receive the third signal SIG<2> through the fourth TSV TSV14. Accordingly, the TSV selection signals TSVSEL<0:nn> are inputted to the repair circuit 60 to detour a transmission path for a signal which is otherwise to be transmitted through a failed TSV, to a normal TSV, so that normal transmission of the signal can be made possible.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a clock division unit configured to divide a clock signal and generate a plurality of divided clock signals;
   a transmission control signal generation unit configured to receive the plurality of the divided clock signals to generate transmission control signals from the plurality of divided clock signals;
   a fuse signal transmission unit configured to transmit fuse information in synchronization with the transmission control signals;
   a reception control signal generation unit configured to receive the plurality of divided clock signals, and generate reception control signals based on the plurality of divided clock signals; and
   a fuse signal reception unit configured to receive the fuse information in synchronization with the reception control signals.

2. The semiconductor apparatus according to claim 1, wherein the transmission control signal generation unit comprises:
   a first clock decoding section configured to decode the plurality of divided clock signals and generate the transmission control signals which are sequentially enabled.

3. The semiconductor apparatus according to claim 2, wherein the fuse signal transmission unit receives fuse signals which are inputted in parallel, every time the transmission control signals are sequentially enabled, and generates the fuse transmission signals which are outputted in series.

4. The semiconductor apparatus according to claim 3, wherein the reception control signal generation unit comprises:
   a second clock decoding section configured to decode the plurality of divided clock signals and generate the reception control signals which are sequentially enabled.

5. The semiconductor apparatus according to claim 3, wherein the fuse signal reception unit receives the fuse transmission signals which are inputted in series, every time the reception control signals are sequentially enabled, and generates fuse output signals which are outputted in parallel.

6. The semiconductor apparatus according to claim 5, further comprising:
   a through-silicon via (TSV) selection unit configured to decode the fuse output signals and generate TSV selection signals.

7. A semiconductor apparatus comprising:
   a clock division unit configured to divide a clock signal and generate a plurality of divided clock signals;
   a signal transmission block configured to transmit fuse information in response to the divided clock signals;
   a master chip signal reception block disposed in a master chip, and configured to receive the fuse information in response to the plurality of divided clock signals and generate through-silicon via (TSV) selection signals; and
   a slave chip signal reception block disposed in a slave chip, and configured to receive the fuse information in response to the plurality of divided clock signals and generate the TSV selection signals.

8. The semiconductor apparatus according to claim 7, wherein the signal transmission block comprises:
   a transmission control signal generation unit configured to generate transmission control signals from the plurality of divided clock signals; and
   a fuse signal transmission unit configured to generate fuse transmission signals from fuse signals in synchronization with the transmission control signals.

9. The semiconductor apparatus according to claim 8, wherein transmission control signal generation unit generates the transmission control signals which are sequentially enabled, by decoding the plurality of divided clock signals.

10. The semiconductor apparatus according to claim 9, wherein the fuse signal transmission unit receives the fuse signals which are inputted in parallel, every time the transmission control signals are sequentially enabled, and generates the fuse transmission signals which are outputted in series.

11. The semiconductor apparatus according to claim 8, wherein the master chip signal reception block comprises:
   a reception control signal generation unit configured to generate reception control signals from the plurality of divided clock signals;
   a fuse signal reception unit configured to generate fuse output signals from the fuse transmission signals in synchronization with the reception control signals; and
   a TSV selection unit configured to decode the fuse output signals and generate the TSV selection signals.

12. The semiconductor apparatus according to claim 11, wherein the reception control signals have substantially the same phases as the transmission control signals.

13. The semiconductor apparatus according to claim 11, wherein the reception control signal generation unit includes a decoding section configured to decode the plurality of divided clock signals and generate the reception control signals which are sequentially enabled.

14. The semiconductor apparatus according to claim 11, wherein the fuse signal reception unit receives the fuse transmission signals which are inputted in series, every time the reception control signals are sequentially enabled, and generates the fuse output signals which are outputted in parallel.

15. The semiconductor apparatus according to claim 8, wherein the slave chip signal reception block comprises:
   a reception control signal generation unit configured to generate reception control signals from the plurality of divided clock signals;
   a fuse signal reception unit configured to receive the fuse transmission signals in synchronization with the reception control signals and generate fuse output signals; and
   a TSV selection unit configured to decode the fuse output signals and generate the TSV selection signals.

16. The semiconductor apparatus according to claim 15, wherein the reception control signals have substantially the same phases as the transmission control signals.

17. The semiconductor apparatus according to claim 15, wherein the reception control signal generation unit decodes the plurality of divided clock signals and generates the reception control signals which are sequentially enabled.

18. The semiconductor apparatus according to claim 15, wherein the fuse signal reception unit receives the fuse transmission signals which are inputted in series, every time the reception control signals are sequentially enabled, and generates the fuse output signals which are outputted in parallel.

19. The semiconductor apparatus according to claim 7, further comprising:
   a repair circuit configured to set paths of signals to be transmitted from the master chip to the slave chip, in response to the TSV selection signals.

20. The semiconductor apparatus according to claim 19, wherein the repair circuit comprises:
   first and second TSVs configured to transmit a first signal;
   a transceiver configured to output the first signal to any one of the first and second TSVs in response to the TSV selection signals; and
   a receiver configured to receive the first signal through one of the first and second TSVs in response to the TSV selection signals.

* * * * *